(12) United States Patent
Ushikubo (10) Patent No.: US 10,950,816 B2
(45) Date of Patent: Mar. 16, 2021

(54) DISPLAY DEVICE FOR SUPPRESSING LIGHT EMISSION IN ADJACENT PIXEL DUE TO CURRENT LEAKAGE

(71) Applicant: Japan Display Inc., Minato-ku (JP)

(72) Inventor: Takahiro Ushikubo, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 5 days.

(21) Appl. No.: 15/919,244

(22) Filed: Mar. 13, 2018

(65) Prior Publication Data

US 2018/0287089 A1 Oct. 4, 2018

(30) Foreign Application Priority Data

Apr. 4, 2017 (JP) .............................. JP2017-074160

(51) Int. Cl.
*H01L 51/50* (2006.01)
*H01L 27/32* (2006.01)
*H01L 51/52* (2006.01)

(52) U.S. Cl.
CPC ........ *H01L 51/5044* (2013.01); *H01L 27/326* (2013.01); *H01L 27/3213* (2013.01); *H01L 27/3218* (2013.01); *H01L 27/3244* (2013.01); *H01L 51/5048* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 51/5218* (2013.01); *H01L 51/5234* (2013.01); *H01L 51/5253* (2013.01); *H01L 51/5278* (2013.01); *H01L 2251/5315* (2013.01)

(58) Field of Classification Search
CPC .......... H01L 51/50; H01L 27/32; H01L 51/52

USPC ........................................... 313/504; 362/304
See application file for complete search history.

(56) References Cited

U.S. PATENT DOCUMENTS

| | | | | |
|---|---|---|---|---|
| 2008/0088724 A1* | 4/2008 | Kudoh | .............. | H01L 27/14641 348/300 |
| 2010/0134664 A1* | 6/2010 | Kuroda | ................ | H04N 5/3741 348/280 |
| 2014/0131692 A1* | 5/2014 | Mishima | ............. | H01L 51/5088 257/40 |
| 2015/0333296 A1* | 11/2015 | Lee | ..................... | H01L 51/5064 257/40 |
| 2017/0317150 A1* | 11/2017 | Chung | ................ | H01L 27/3216 |
| 2017/0352707 A1* | 12/2017 | Kim | ...................... | H01L 27/322 |

FOREIGN PATENT DOCUMENTS

| | | |
|---|---|---|
| JP | 2011-216778 | 10/2011 |
| JP | 2013-58322 | 3/2013 |

* cited by examiner

*Primary Examiner* — Sheng-Bai Zhu
(74) *Attorney, Agent, or Firm* — Oblon, McClelland, Maier & Neustadt, L.L.P.

(57) ABSTRACT

A display device may include a plurality of pixel electrodes arranged in a matrix along a first direction and a second direction perpendicular to each other. A plurality of light-emitting layers overlap with the respective plurality of pixel electrodes. A plurality of carrier generation layers are separated from one another. Each of the plurality of carrier generation layers continuously overlap with two of the plurality of light-emitting layers. The two are next to each other in a direction oblique to both the first direction and the second direction. A common electrode is opposed to the plurality of pixel electrodes.

9 Claims, 11 Drawing Sheets

DISPLAY DEVICE FOR SUPPRESSING LIGHT EMISSION IN ADJACENT PIXEL DUE TO CURRENT LEAKAGE

CROSS-REFERENCE TO RELATED APPLICATION

The present application claims priority from Japanese application JP2017-074160 filed on Apr. 4, 2017, the content of which is hereby incorporated by reference into this application.

BACKGROUND OF THE INVENTION

1. Field of the Invention

This pertains to a display device.

2. Description of the Related Art

An organic electroluminescence display device is configured to emit light by a current through an organic film between an anode and a cathode (JP 2011-216778A and JP 2013-058322A). The organic film, in addition to a light-emitting layer, includes a layer for improving carrier implantation efficiency and carrier mobility, with at least one layer thereof being continuous all over a display area. The current flows in a thickness direction of the light-emitting layer to emit light in each pixel, accompanied by a phenomenon where a leakage current flows through the organic film in a lateral direction to emit light in an adjacent pixel. This phenomenon has a larger impact on higher definition, leading to degradation in image quality.

The current leakage in the lateral direction can be prevented by patterning every layer constituting the organic film. Due to a limit to high-definition patterning, however, multiple vapor deposition processes are required, necessitating use of multiple fine metal masks. For example, JP 2011-216778A discloses a structure where layers have different thicknesses from color to color. JP 2013-058322A discloses that the light-emitting layers are separated from color to color, without referring to other layers being patterned.

SUMMARY OF THE INVENTION

This aims to suppress a phenomenon of emitting light in an adjacent pixel by a current leaking in a lateral direction.

A display device may include a plurality of pixel electrodes arranged in a matrix along a first direction and a second direction perpendicular to each other. A plurality of light-emitting layers may overlap with the respective plurality of pixel electrodes. A plurality of carrier generation layers may be separated from one another. Each of the plurality of carrier generation layers may continuously overlap with two of the plurality of light-emitting layers. The two are next to each other in a direction oblique to both the first direction and the second direction. A common electrode is opposed to the plurality of pixel electrodes.

The two light-emitting layers, with which each carrier generation layer continuously overlaps, are arranged in the direction oblique to both the first direction and the second direction and are further away from each other than other two light-emitting layers arranged in the first direction or second direction, suppressing the phenomena where current leaking in a lateral direction to emit light in the adjacent pixel.

DETAILED DESCRIPTION OF THE INVENTION

Hereinafter, embodiments will be described with reference to the drawings. Here, the invention can be embodied according to various aspects within the scope of the invention without departing from the gist of the invention and is not construed as being limited to content described in the embodiments exemplified below.

The drawings are further schematically illustrated in widths, thickness, shapes, and the like of units than actual forms to further clarify description in some cases, but are merely examples and do not limit interpretation of the invention. In the present specification and the drawings, the same reference numerals are given to elements having the same functions described in the previously described drawings and the repeated description will be omitted.

Further, in the detailed description, "on" or "under" in definition of positional relations of certain constituents and other constituents includes not only a case in which a constituent is located just on or just under a certain constituent but also a case in which another constituent is interposed between constituents unless otherwise mentioned.

Figure 1:
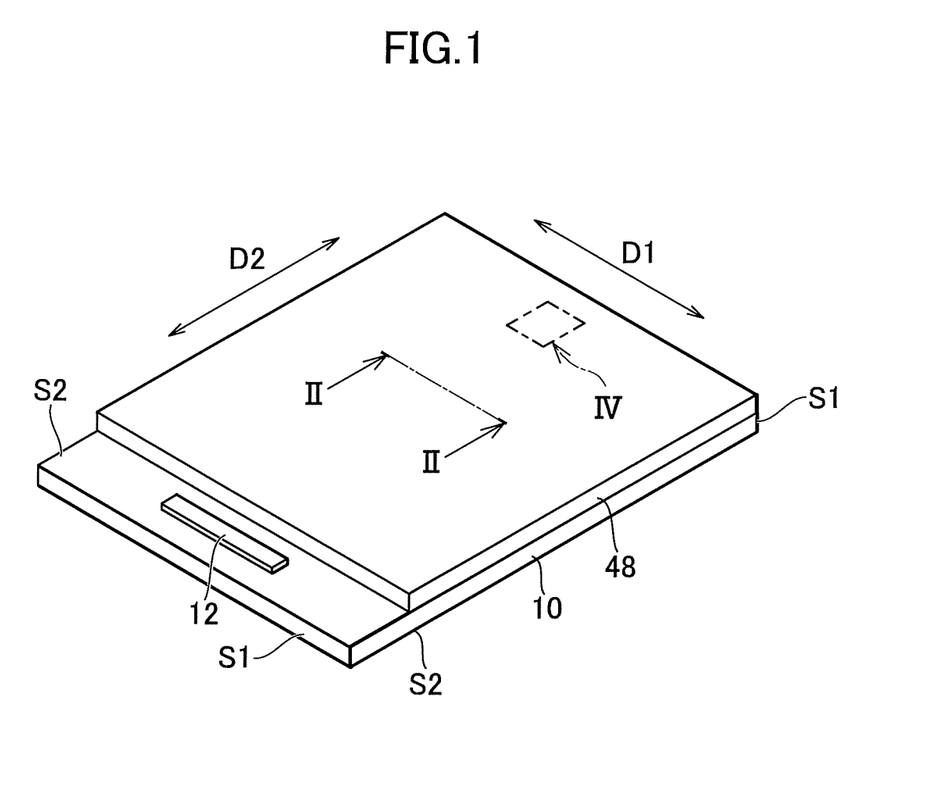
FIG. 1 is a perspective view of a display device in accordance with an embodiment.

FIG. 1 is a perspective view of a display device in accordance with an embodiment. The display device is an organic electroluminescence display device. The display device is configured to display a full-color image in full-color pixels, each of which consists of combination of unit pixels (subpixels) of colors such as red, green, and blue. The display device incudes a first substrate 10. The first substrate 10 has a rectangular planar shape with a side S1 parallel to a first direction D1 and a side S2 parallel to a second direction D2. The first direction D1 and the second direction D2 are perpendicular to each other. The first substrate 10 may have an integrated circuit chip 12 mounted thereon for driving an element to display the image and an unillustrated flexible printed circuit board connected thereto for external electrical connection.

Figure 2:
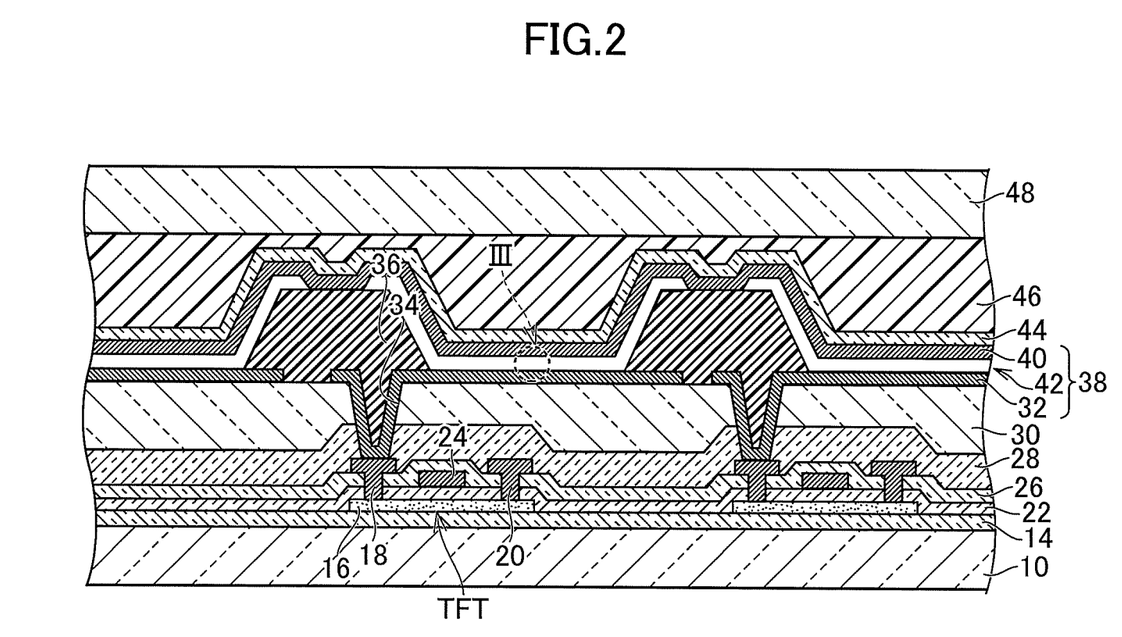
FIG. 2 is an enlarged view of a portion of a II-II line cross section of the display device in FIG. 1.

FIG. 2 is an enlarged view of a portion of a II-II line cross section of the display device in FIG. 1. The first substrate 10 has an undercoat layer 14 formed thereon for a barrier against impurities contained therein. On the undercoat layer 14 is a semiconductor layer 16. A source electrode 18 and a drain electrode 20 are electrically connected to the semiconductor layer 16; a gate insulating layer 22 is formed to cover the semiconductor layer 16. On the gate insulating layer 22 sits a gate electrode 24, which is covered with an interlayer dielectric 26. The source electrode 18 and the drain electrode 20 penetrate the gate insulating layer 22 and the interlayer dielectric 26. The semiconductor layer 16, the source electrode 18, the drain electrode 20, and the gate electrode 24 constitute at least part of a thin film transistor TFT, which is covered with a passivation film 28.

A planarization film 30 is formed over the passivation film 28. On the planarization film 30 are a plurality of electrodes 32 (e.g. anode) configured to correspond to the respective unit pixels. The planarization film 30 is formed to be flat on a surface where at least the pixel electrodes 32 are disposed. The pixel electrode 32 is electrically connected to one of the source electrode 18 and the drain electrode 20 on the semiconductor layer 16 through a contact hole 34 penetrating the planarization film 30 and passivation film 28.

On the planarization film 30 and the pixel electrode 32 is an insulation layer 36, which is formed to sit on a periphery of the pixel electrode 32 and to have an opening to expose a portion (e.g. central portion) of the pixel electrode 32. The insulation layer 36 constitutes a bank around the portion of the pixel electrode 32. The pixel electrode 32 is part of the light-emitting element 38. The light-emitting element 38 further includes a common electrode 40 (e.g. cathode) and an organic electroluminescence layer 42. The common electrode 40 is opposed to the plurality of pixel electrodes 32.

Figure 3:
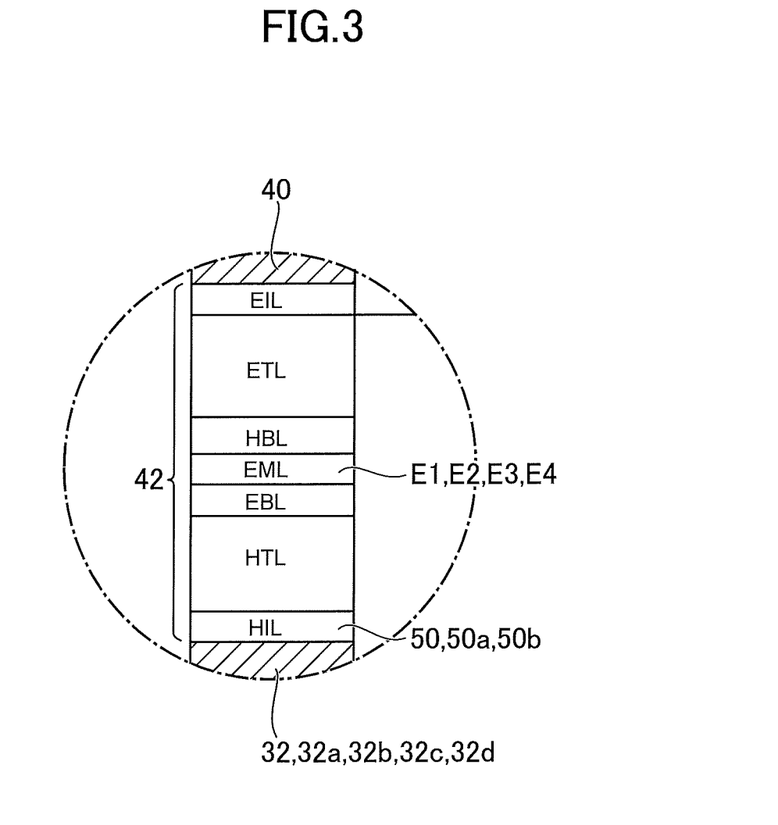
FIG. 3 is an enlarged view of a portion pointed by III of the display device in FIG. 2.

FIG. 3 is an enlarged view of a portion pointed by III of the display device in FIG. 2. The organic electroluminescence layer 42 includes light-emitting layers EML. The light-emitting layers EML are disposed (separately) on the respective pixel electrodes 32 and sit on the insulation layer 36 as well. In this case, the light-emitting layer EML emits light in blue, red, or green in accordance with the corresponding pixel. The color in accordance with each pixel is not limited thereto and may be yellow or white. The light-emitting layer EML may be formed by vapor deposition or may be formed to entirely cover the display area over the plurality of pixels. The light-emitting layer EML may be formed to be continuous over the insulation layer 36. In this case, the light-emitting layer EML is formed by a coating method using solvent dispersion. The light-emitting layer EML over the plurality of pixels is configured to emit white light at every subpixel, with intended color wavelengths extracted through a color filter unillustrated.

Between the pixel electrode 32 and the light-emitting layer EML is interposed a hole injection layer HIL and a hole transport layer HTL. Additionally, between the hole transport layer HTL and the light-emitting layer EML is an electron block layer EBL. The hole injection layer HIL is in contact with the pixel electrode 32. Between the common electrode 40 and the light-emitting layer EML is an electron injection layer EIL and an electron transport layer ETL. Additionally, between the electron transport layer ETL and the light-emitting layer EML is a hole block layer HBL.

The light-emitting layer EML is between the pixel electrode 32 and the common electrode 40 to emit light, with brightness controlled by a current flowing therebetween. The common electrode 40 may be made from a metallic thin film with light transmission properties, displaying an image by transmitting light generated in the light-emitting layer EML. The pixel electrode 32 includes a reflective film for reflecting the light generated in the light-emitting layer EML toward the common electrode 40.

As shown in FIG. 2, the light-emitting element 38 is blocked from moisture by being sealed with a sealing film 44. The sealing film 44 includes an inorganic layer formed from an inorganic material such as silicon nitride and may have a structure where an organic layer is interposed between a pair of inorganic layers. A second substrate 48 is attached to the sealing film 44 with an adhesive layer 46 interposed therebetween.

Figure 4:
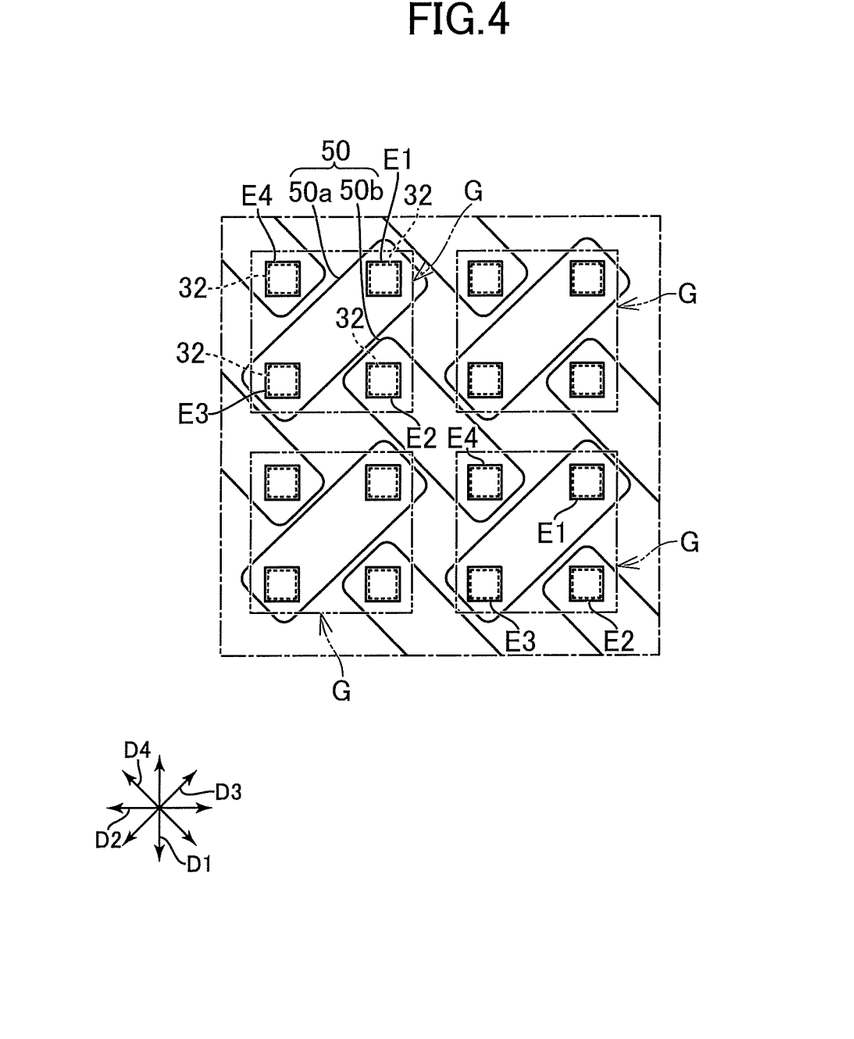
FIG. 4 is an enlarged partial view of an area pointed by IV of the display device in FIG. 1.

FIG. 4 is an enlarged partial view of an area pointed by IV of the display device in FIG. 1. The plurality of pixel electrodes 32 are arranged in a matrix along a first direction D1 and a second direction D2 perpendicular to each other. The plurality of light-emitting layers EML (E1, E2, E3, E4) are separated from one another. The plurality of light-emitting layers EML overlap with the respective plurality of pixel electrodes 32.

The plurality of light-emitting layers EML fall into some groups G. Each group G includes a first light-emitting layer E1, a second light-emitting layer E2, a third light-emitting layer E3, and a fourth light-emitting layer E4, arranged in a clockwise direction. The first light-emitting layer E1 and the second light-emitting layer E2 are next to each other in the first direction D1. The second light-emitting layer E2 and the third light-emitting layer E3 are next to each other in the second direction D2. The third light-emitting layer E3 and the fourth light-emitting layer E4 are next to each other in the first direction D1. The fourth light-emitting layer E4 and the first light-emitting layer E1 are next to each other in the second direction D2. The first light-emitting layer E1 and the third light-emitting layer E3 are next to each other in a third direction D3, which is oblique to both the first direction D1 and second direction D2. The second light-emitting layer E2 and the fourth light-emitting layer E4 are next to each other in a fourth direction D4, which is oblique to both the first direction D1 and second direction D2. The third direction D3 and the fourth direction D4 are perpendicular to each other. At least three of the first light-emitting layer E1, the second light-emitting layer E2, the third light-emitting layer E3, and the fourth light-emitting layer E4 are configured to emit light in colors different from one another for forming the full-color pixel.

In the embodiment, the hole injection layer HIL, which is in close contact with each pixel electrode 32, is a carrier generation layer 50. The carrier generation layer 50 is formed from an organic material with acceptors doped therein for serving to accept electrons. The acceptors turn into acceptor ions upon acceptance of the electrons, generating holes. The acceptors serve to accept the electrons from the organic material.

The carrier generation layers 50 are separated from one another. Each carrier generation layer 50 continuously overlaps with two light-emitting layers EML, which are next to each other in a direction (e.g. third direction D3 or fourth direction D4) oblique to both the first direction D1 and the second direction D2.

The plurality of carrier generation layers 50 include first carrier generation layers 50a. Each first carrier generation layer 50a overlaps with the first light-emitting layer E1 and the third light-emitting layer E3 included in a corresponding group G. Specifically, the first carrier generation layer 50a continuously overlaps with two adjacent light-emitting layers EML next to each other in the third direction D3.

The plurality of carrier generation layers 50 include second carrier generation layers 50b. Each second carrier generation layer 50b overlaps with the second light-emitting layer E2 and the fourth light-emitting layer E4 included in a corresponding pair of groups G next to each other in the fourth direction D4. Specifically, the second carrier generation layer 50b continuously overlaps with two adjacent light-emitting layers EML next to each other in the fourth direction D4.

The two light-emitting layers EML, with which each carrier generation layer 50 continuously overlaps, are arranged in the direction (third direction D3 or fourth direction D4) oblique to both the first direction D1 and the second direction D2 and are further away from each other than other two light-emitting layers EML arranged in the first direction D1 or second direction D2, suppressing the phenomena where the current leaking in a lateral direction to emit the light in the adjacent pixel.

Figure 5:
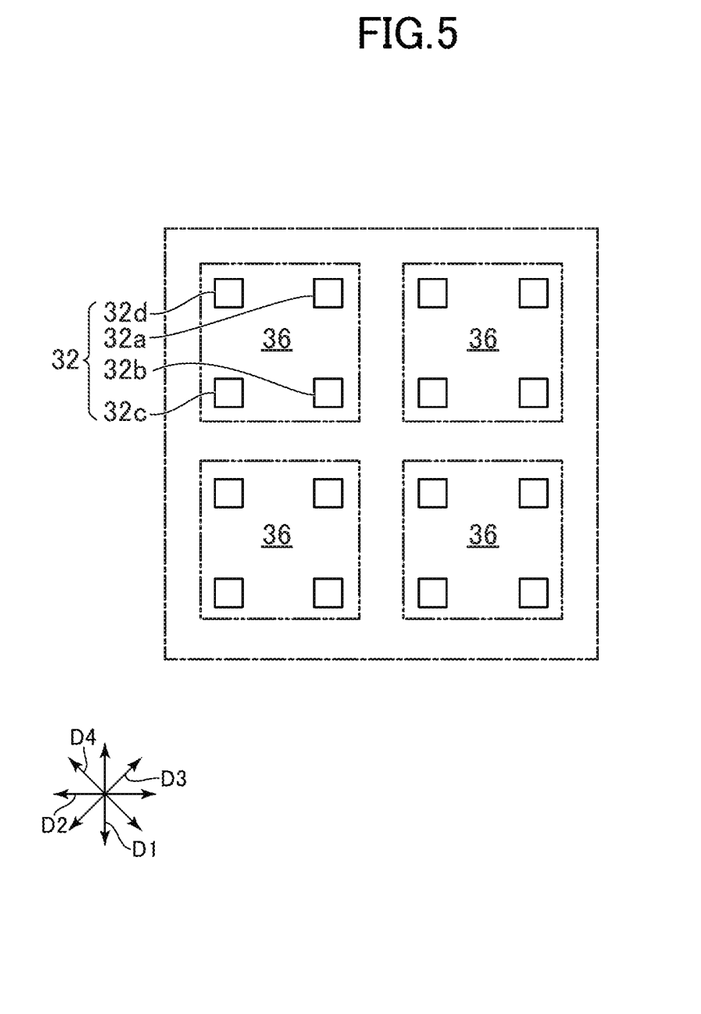
FIG. 5 is a diagram of illustrating some pixel electrodes exposed from an insulation layer.

FIGS. 5-9 are diagrams to explain a manufacturing method of the display device in accordance with the embodiment. FIG. 5 is a diagram of illustrating some pixel electrodes 32 exposed from an insulation layer 36. Any processes leading to the illustration may be obvious from the foregoing disclosure, their explanations omitted.

The plurality of pixel electrodes 32 fall into some groups. Each group includes a first pixel electrode 32a, a second pixel electrode 32b, a third pixel electrode 32c, and a fourth pixel electrode 32d, arranged in a clockwise direction. The first pixel electrode 32a and the second pixel electrode 32b are next to each other in the first direction D1. The second pixel electrode 32b and the third pixel electrode 32c are next to each other in the second direction D2. The third pixel electrode 32c and the fourth pixel electrode 32d are next to each other in the first direction D1. The fourth pixel electrode 32d and the first pixel electrode 32a are next to each other in the second direction D2. The first pixel electrode 32a and the third pixel electrode 32c are next to each other in the third direction D3. The second pixel electrode 32b and the fourth pixel electrode 32d are next to each other in the fourth direction D4.

Figure 6:
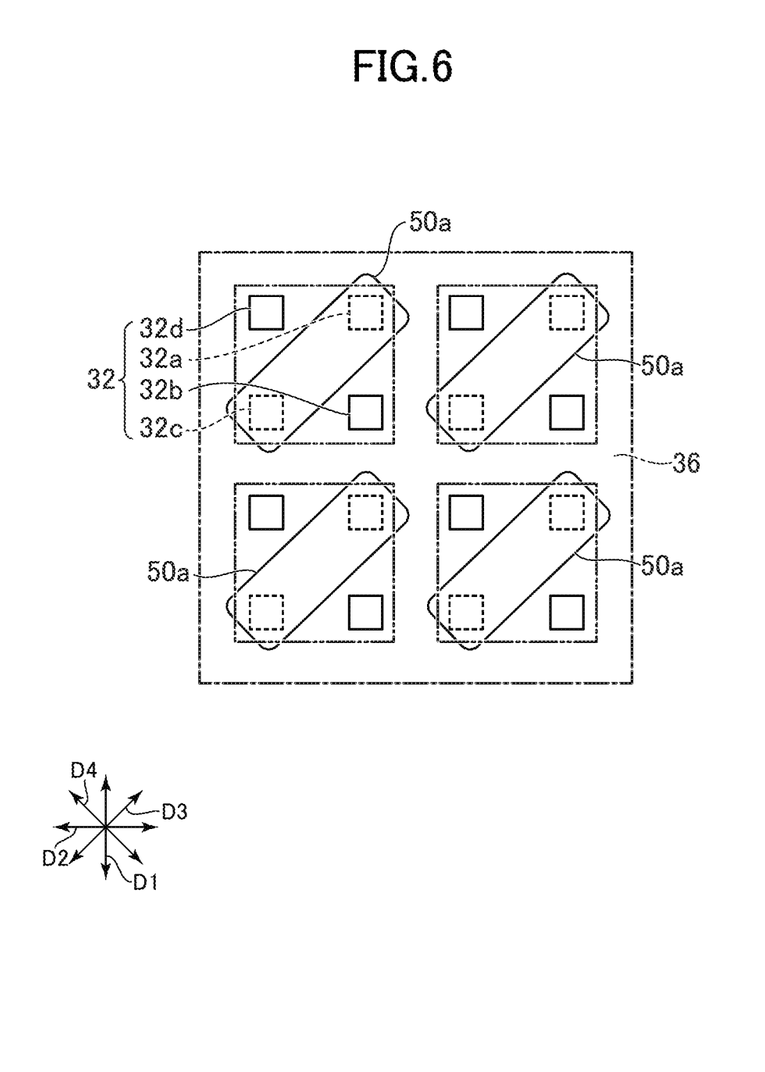
FIG. 6 is a diagram of explaining a process of forming first carrier generation layers.

FIG. 6 is a diagram of explaining a process of forming first carrier generation layers 50a. As shown in FIG. 6, the first carrier generation layers 50a (hole injection layer HIL) are formed on the pixel electrodes 32 and insulation layer 36. Each first carrier generation layer 50a overlaps with the first pixel electrode 32a and the third pixel electrode 32c, included in corresponding one of the groups. The first pixel electrode 32a and the third pixel electrode 32c are next to each other in the direction (e.g. third direction D3) oblique to both the first direction D1 and the second direction D2.

Figure 7:
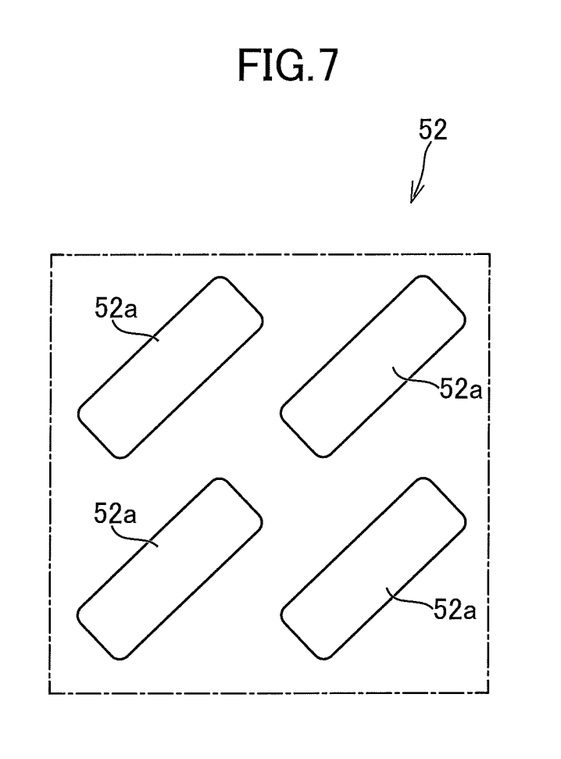
FIG. 7 is a diagram of illustrating a first mask for forming first carrier generation layers.

FIG. 7 is a diagram of illustrating a first mask for forming first carrier generation layers 50a. The first mask 52 has a plurality of openings 52a corresponding to the respective first carrier generation layers 50a. The first carrier generation layers 50a are formed by vapor deposition using the first mask 52.

Figure 8:
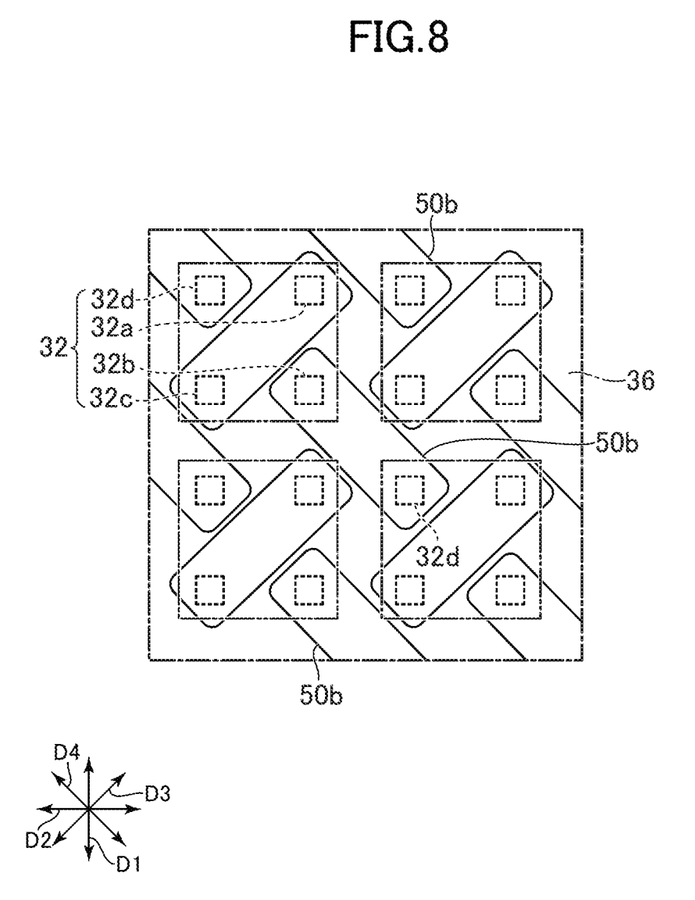
FIG. 8 is a diagram of explaining a process of forming second carrier generation layers.

FIG. 8 is a diagram of explaining a process of forming second carrier generation layers 50b. As shown in FIG. 8, the second carrier generation layers 50b (hole injection layer HIL) are formed on the pixel electrodes 32 and the insulation layer 36. Each second carrier generation layer 50b overlaps with the second pixel electrode 32b and the fourth pixel electrode 32d included in a corresponding pair of the groups next to each other in the fourth direction D4.

Figure 9:
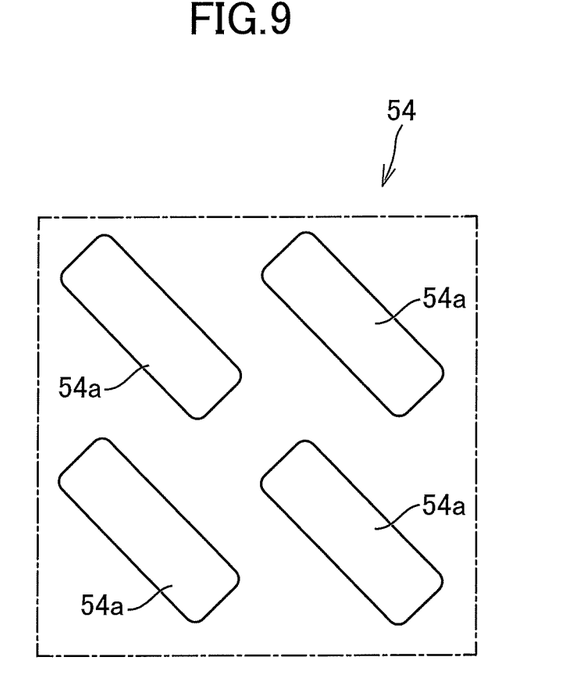
FIG. 9 is a diagram of illustrating a second mask for forming second carrier generation layers.

FIG. 9 is a diagram of illustrating a second mask 54 for forming second carrier generation layers 50b. The second mask 54 has a plurality of openings 54a corresponding to the respective second carrier generation layers 50b. The second carrier generation layers 50b are formed by vapor deposition using the second mask 54. Alternatively, the first mask 52 in FIG. 7, with 90-degree rotation, may be substituted for the second mask 54.

Figure 10:
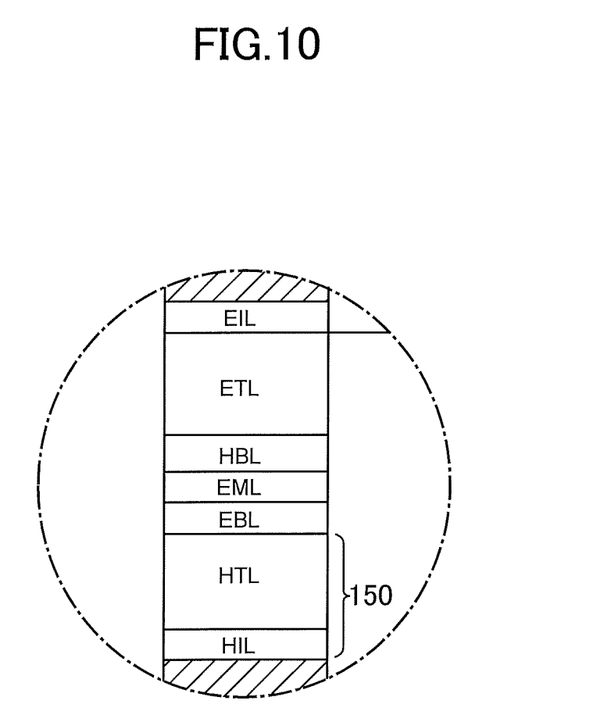
FIG. 10 is a diagram of illustrating a variation 1 of the embodiment.

FIG. 10 is a diagram of illustrating a variation 1 of the embodiment. In this variation, the carrier generation layer 150 includes a hole injection layer HIL and a hole transport layer HTL. The acceptors serve to accept electrons from the hole transport layer HTL. The invention includes such an example.

Figure 11:
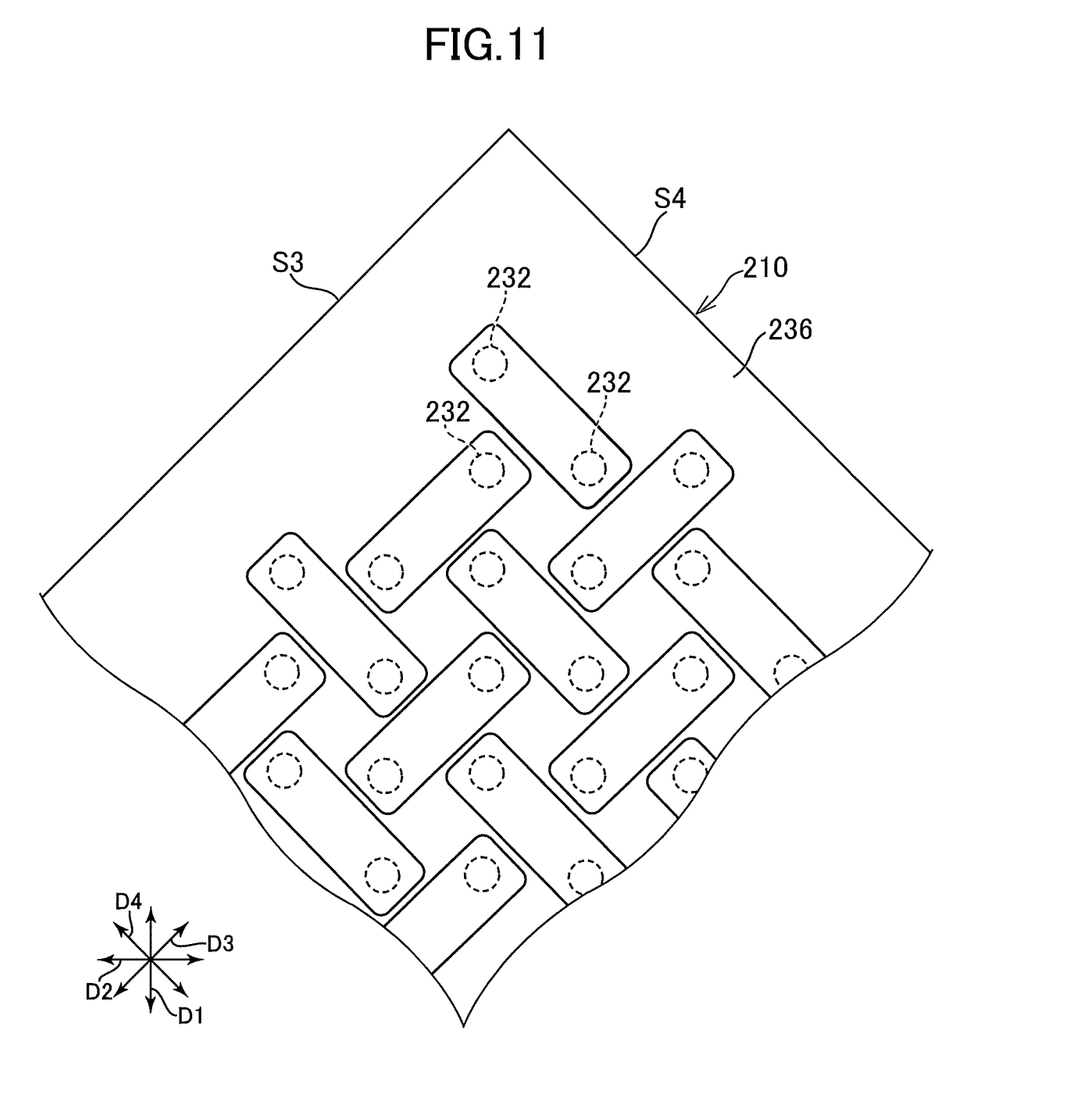
FIG. 11 is a diagram of illustrating a variation 2 of the embodiment.

FIG. 11 is a diagram of illustrating a variation 2 of the embodiment. This variation differs from the above embodiment in that the pixel electrode 232 has a planar shape (specifically an area exposed from the insulation layer 236) formed in a circle. The pixel electrodes 232 are arranged in a matrix along the first direction D1 and the second direction D2. The first substrate 210 has a third side S3 parallel to the third direction D3 and a fourth side S4 parallel to the fourth direction D4. The invention includes such an example.

The display device is not limited to the organic electroluminescence display device but may be a display device with light-emitting elements disposed in respective pixels, such as a quantum-dot light-emitting diode (QLED).

While there have been described what are at present considered to be certain embodiments, it will be understood that various modifications may be made thereto, and it is intended that the appended claims cover all such modifications as fall within the true spirit and scope of the invention.

What is claimed is:

1. A display device comprising:
   a plurality of pixel electrodes arranged in a matrix along a first direction and a second direction perpendicular to each other;
   an insulation layer including a portion on a periphery of each of the plurality of pixel electrodes, the insulation layer including openings to expose respective portions of the plurality of pixel electrodes;
   a plurality of light-emitting layers overlapping with the respective plurality of pixel electrodes, the plurality of light-emitting layers being separated from one another, a first pair of light-emitting layers of the plurality of light-emitting layers being closest to each other in the first direction or the second direction, a second pair of light-emitting layers of the plurality of light-emitting layers being closest to each other in one of a third direction and a fourth direction perpendicular to each other, each of the third direction and the fourth direction being oblique to both the first direction and the second direction, the second pair of light-emitting layers being farther away from each other than the first pair of light-emitting layers;
   a plurality of carrier generation layers on the insulation layer and on the plurality of pixel electrodes inside the openings, the plurality of carrier generation layers being separated from one another on the insulation layer, some of the plurality of carrier generation layers extending in the third direction, others of the plurality of carrier generation layers extending in the fourth direction, each of the plurality of carrier generation layers continuously overlapping with the second pair of light-emitting layers, wherein each of the plurality of carrier generation layers do not continuously overlap with the first pair of light-emitting layers; and
   a common electrode opposed to the plurality of pixel electrodes.

2. The display device according to claim 1, wherein the plurality of light-emitting layers fall into some groups, each of the groups including a first light-emitting layer, a second light-emitting layer, a third light-emitting layer, and a fourth light-emitting layer, arranged in clockwise direction, the first light-emitting layer and the second light-emitting layer are next to each other in the first direction, the second light-emitting layer and the third light-emitting layer are next to each other in the second direction, the third light-emitting layer and the fourth light-emitting layer are next to each other in the first direction, the fourth light-emitting layer and the first light-emitting layer are next to each other in the second direction, the first light-emitting layer and the third light-emitting layer are next to each other in the third direction, the second light-emitting layer and the fourth light-emitting layer are next to each other in the fourth direction, the plurality of carrier generation layers include first carrier generation layers and second carrier generation layers, each of the first carrier generation layers overlaps with the first light-emitting layer and the third light-emitting layer included in a corresponding one of the groups, and each of the second carrier generation layers overlaps with the second light-emitting layer and the fourth light-emitting layer included in a corresponding pair of the groups next to each other in the fourth direction.

3. The display device according to claim 2, wherein at least three of the first light-emitting layer, the second light-emitting layer, the third light-emitting layer, and the fourth light-emitting layer are configured to emit light in colors different from one another for a corresponding one pixel of full color.

4. The display device according to claim 1, further comprising a substrate on which the plurality of pixel electrodes are disposed, wherein the substrate has a rectangular planar shape with a side parallel to the first direction and another side parallel to the second direction.

5. The display device according to claim 2, further comprising a substrate on which the plurality of pixel electrodes are disposed, wherein the substrate has a rectangular planar shape with a side parallel to the third direction and another side parallel to the fourth direction.

6. The display device according to claim 1, wherein each of the plurality of carrier generation layers is formed from an organic material with acceptors doped therein for serving to accept electrons, generating holes by the acceptors turning into acceptor ions upon acceptance of the electrons.

7. The display device according to claim 6, wherein the acceptors serve to accept the electrons from the organic material.

8. The display device according to claim 6, wherein each of the plurality of carrier generation layers is a hole injection layer, which is in close contact with corresponding two of the plurality of pixel electrodes.

9. The display device according to claim 6, wherein each of the plurality of carrier generation layers includes a hole injection layer in close contact with corresponding two of the plurality of pixel electrodes and a hole transport layer in close contact between corresponding two of the plurality of light-emitting layers and the hole injection layer, and the acceptors serve to accept the electrons from the hole transport layer.

* * * * *